(12) United States Patent
Helbig

(10) Patent No.: US 9,716,215 B2
(45) Date of Patent: Jul. 25, 2017

(54) HEAT SINK FOR AN ILLUMINATION DEVICE

(71) Applicant: OSRAM GmbH, Munich (DE)

(72) Inventor: Peter Helbig, Sontheim an der Brenz (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/002,441

(22) Filed: Jan. 21, 2016

(65) Prior Publication Data

US 2016/0218265 A1    Jul. 28, 2016

(30) Foreign Application Priority Data

Jan. 23, 2015    (DE) .................. 10 2015 201 152

(51) Int. Cl.
| | |
|---|---|
| *F21V 29/00* | (2015.01) |
| *H01L 33/64* | (2010.01) |
| *H01L 23/36* | (2006.01) |
| *H01L 23/373* | (2006.01) |
| *F21V 23/00* | (2015.01) |
| *F21V 29/70* | (2015.01) |
| *F21V 29/87* | (2015.01) |
| *F21V 29/89* | (2015.01) |
| *F21K 9/232* | (2016.01) |
| *F21Y 115/10* | (2016.01) |

(52) U.S. Cl.
CPC ............ *H01L 33/641* (2013.01); *F21K 9/232* (2016.08); *F21V 23/001* (2013.01); *F21V 29/70* (2015.01); *F21V 29/87* (2015.01); *F21V 29/89* (2015.01); *H01L 23/36* (2013.01); *H01L 23/3737* (2013.01); *F21Y 2115/10* (2016.08); *H01L 2933/0075* (2013.01)

(58) Field of Classification Search
CPC ............ H01L 33/641; H01L 2933/0075; H01L 23/36; H01L 23/3737; F21V 29/70; F21V 29/87; F21V 29/89; F21V 23/001; F21K 9/232; F21Y 2115/10
USPC ... 362/294, 480, 547, 218, 249.02, 373, 391
See application file for complete search history.

(56) References Cited

U.S. PATENT DOCUMENTS

| | | | | |
|---|---|---|---|---|
| 2002/0158567 | A1* | 10/2002 | Arakawa | H01J 65/048 313/492 |
| 2010/0163890 | A1* | 7/2010 | Miskin | H01L 33/641 257/88 |
| 2012/0113633 | A1* | 5/2012 | Bowen | F21L 14/023 362/235 |
| 2014/0043815 | A1 | 2/2014 | Chuang | |

FOREIGN PATENT DOCUMENTS

| | | |
|---|---|---|
| DE | 202012104495 U1 | 11/2012 |
| DE | 102011086789 A1 | 5/2013 |
| WO | 2013079302 A1 | 6/2013 |

OTHER PUBLICATIONS

German Search Report based on Application No. 10 2015 201 152.6 (7 Pages) dated Nov. 2, 2015 (Reference Purpose Only).

* cited by examiner

*Primary Examiner* — Anh Mai
*Assistant Examiner* — Glenn Zimmerman
(74) *Attorney, Agent, or Firm* — Viering, Jentschura & Partner mbB

(57) ABSTRACT

A heat sink for an illumination device may include at least one heat sink portion which includes heat-conducting plastic. At least one metallic heat sink portion is at least partially embedded in the plastic material of the heat-conducting plastic.

5 Claims, 2 Drawing Sheets

HEAT SINK FOR AN ILLUMINATION DEVICE

CROSS-REFERENCE TO RELATED APPLICATION

This application claims priority to German Patent Application Serial No. 10 2015 201 152.6, which was filed Jan.23, 2015, and is incorporated herein by reference in its entirety.

TECHNICAL FIELD

Various embodiments relate generally to a heat sink for an illumination device and to a method for producing such a heat sink. By way of example, various embodiments relate generally to a heat sink for an illumination device which has at least one semiconductor light source.

BACKGROUND

WO 2013/079302 A1 discloses an illumination device for a motor vehicle headlight which has semiconductor light sources and a heat sink for cooling the semiconductor light sources.

SUMMARY

A heat sink for an illumination device may include at least one heat sink portion which includes heat-conducting plastic. At least one metallic heat sink portion is at least partially embedded in the plastic material of the heat-conducting plastic.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
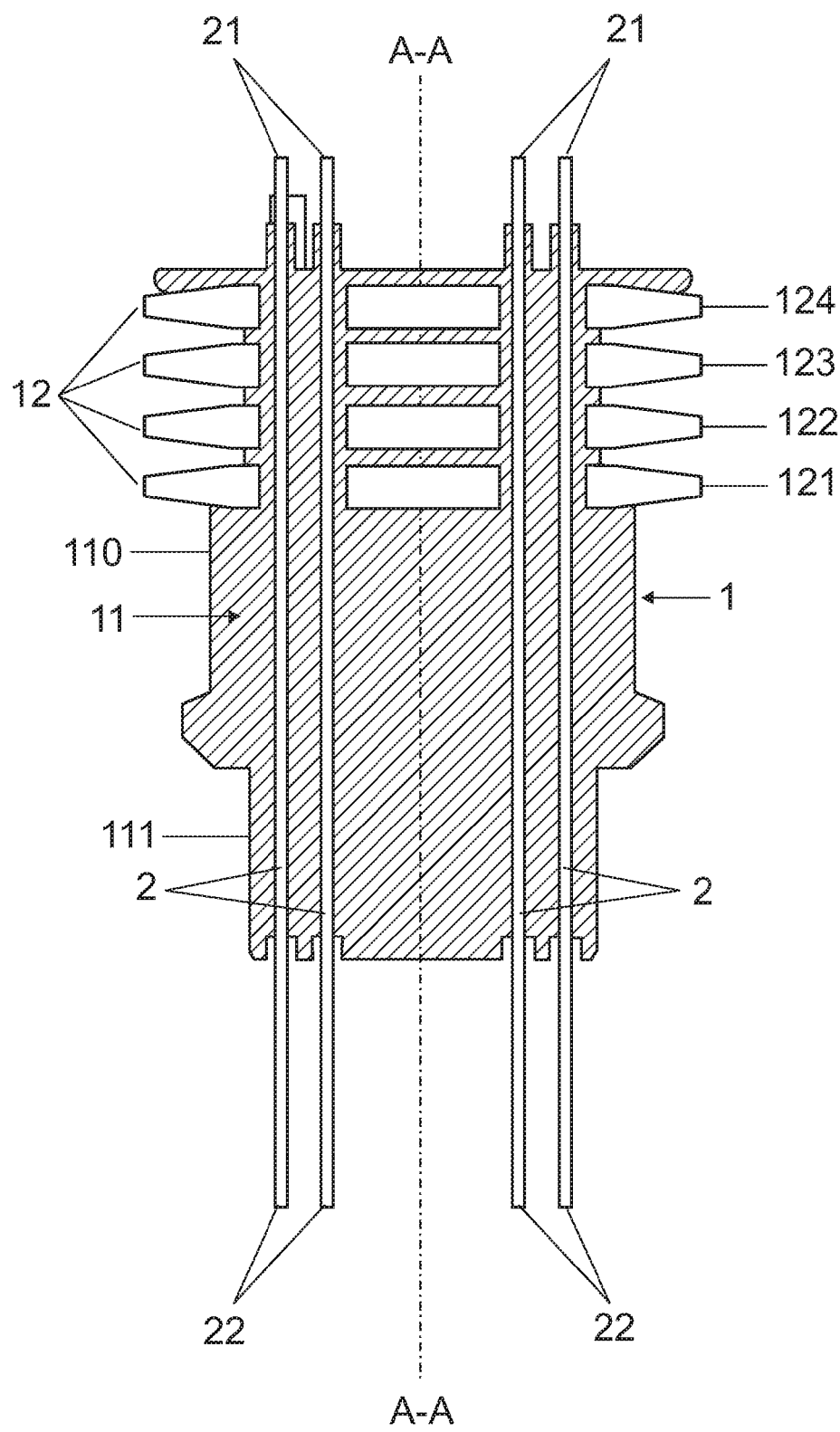
FIG. 1 shows a longitudinal section through a heat sink according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various embodiments provide a heat sink for an illumination device which has a simple structure and can be produced in a simple manner.

The heat sink according to various embodiments may have at least one heat sink portion which includes, e.g. consists of, heat-conducting plastic and in the plastic material of which at least one metallic heat sink portion is at least partially embedded.

On account of its aforementioned features, the heat sink according to various embodiments has a simple structure. In various embodiments, no additional fastening means are required for fixing the metallic heat sink portion and the heat sink portion comprising, e.g. consisting of, heat-conducting plastic. Together with the at least one metallic heat sink portion, the at least one heat sink portion comprising, e.g. consisting of, heat-conducting plastic makes it possible for the light sources and electronic components of an illumination device to be cooled in an optimum manner.

The at least one heat sink portion comprising, consisting of, heat-conducting plastic may be in the form of a plastic injection-molded part. As a result, the heat sink according to various embodiments can be produced in a simple manner.

The at least one heat sink portion comprising, e.g. consisting of, heat-conducting plastic may have an electrically insulating form, in order that it can additionally be used as a mount for electrical contacts or for the insulation of electrical power supply lines. For this reason, it may be provided to use heat-conducting plastics which additionally also are electrically insulating and e.g. are also suitable for plastic injection-molding methods.

The at least one heat sink portion comprising, e.g. consisting of, heat-conducting plastic therefore may include at least one plastic selected from the group consisting of polyamides (PA), polybutylene terephthalate (PBT) and polyphenylene sulfide (PPS).

The at least one metallic heat sink portion may form cooling fins, in order to make good dissipation of heat to the surroundings possible.

A heat sink portion of the heat sink according to various embodiments may be formed as a base provided with power supply lines or electrical contacts. As a result, the heat may also be dissipated via the base and a holder in which the base is arranged.

The heat sink according to various embodiments may be formed as a component part of an illumination device in order to be able to lead the heat generated by the light sources of the illumination device and by any operating electronics for the light sources via the heat sink.

The illumination device according to various embodiments, provided with the heat sink according to various embodiments, may have at least one semiconductor light source, for example a light-emitting diode, and a base, which is compatible with a standardized incandescent lamp base and is provided with electrical contacts or power supply lines for supplying energy to the at least one semiconductor light source. The base may be formed by a heat sink portion which includes, e.g. consists of, heat-conducting plastic and in the plastic material of which a metallic heat sink portion of the heat sink is at least partially embedded. The illumination device according to various embodiments may therefore be formed as what is termed an LED retrofit, the base of which additionally performs a cooling function.

According to various embodiments, the method for producing the heat sink according to various embodiments includes a process during which at least one metallic body is inserted into an injection mold and encapsulated by injection molding with heat-conducting plastic, such that the at least one metallic body is at least partially embedded in the plastic material.

FIG. 1 shows a longitudinal section through the heat sink according to various embodiments. The heat sink 1 has a first heat sink portion 11, which includes, e.g. consists of, heat-conducting and electrically insulating plastic and is in the form of a plastic injection-molded part and may include, e.g. consists of, polyamides (PA), polybutylene terephthalate (PBT) or of polyphenylene sulfide (PPS), and a second, metallic heat sink portion 12, which is formed by four aluminum disks 121, 122, 123, 124 of circular disk shape.

The first heat sink portion 11 has a cylindrical sub-portion 110 and a wedge-shaped sub-portion 111, which is formed as a base and e.g. as what is termed an S8 wedge base or base of IEC category W2.5×16.

The four aluminum disks 121, 122, 123, 124 of circular disk shape are arranged spaced apart from one another and coaxially with the cylinder axis A-A of the cylindrical sub-portion 110 and are partially embedded in the plastic material of the first heat sink portion 11, such that the circular outer edges thereof protrude out of the plastic material of the first heat sink portion 11 and the aluminum disks 121, 122, 123, 124 form cooling fins which project from the outer lateral face of the cylindrical sub-portion 110.

Four power supply wires 2 extending parallel to the cylinder axis A-A of the cylindrical sub-portion 110 of the first heat sink portion 11 are moreover embedded in the plastic material of the first heat sink portion 11, such that a first end 21 of each of said power supply wires 2 protrudes out of the cylindrical sub-portion 110 and the second end 22 in each case protrudes out of the wedge-shaped sub-portion 111 of the first heat sink portion 11. The four aluminum disks 121, 122, 123, 124 have apertures for the four power supply wires 2.

The power supply wires 2 are arranged in the apertures spaced apart from the aluminum disks 121, 122, 123, 124, and the intermediate space between the power supply wires 2 and the aluminum disks 121, 122, 123, 124 is filled with plastic material of the first heat sink portion 11, such that electrical insulation is ensured between the power supply wires 2 and the aluminum disks 121, 122, 123, 124.

Figure 2:
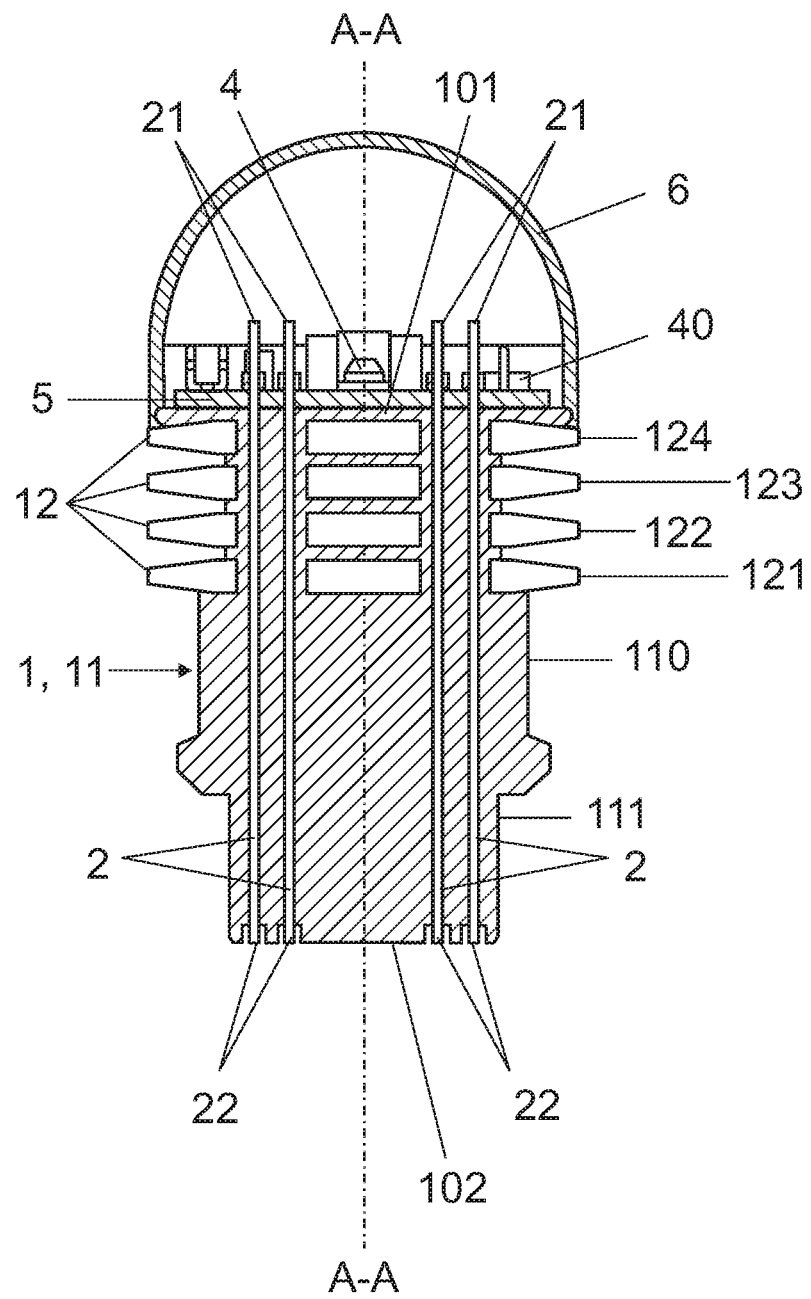
FIG. 2 shows a longitudinal section through an illumination device which is equipped with the heat sink depicted in FIG. 1.

The above-described heat sink 1 shown schematically in FIG. 1 is a component part of the illumination device likewise shown schematically in FIG. 2.

To produce the heat sink 1, the four power supply wires 2 and the four aluminum disks 121, 122, 123, 124 are placed into an injection mold and, after the injection mold has been closed, are encapsulated by injection molding with heat-conducting plastic, such that the power supply wires 2 and the aluminum disks 121, 122, 123, 124 are partially embedded in the plastic material, and the plastic material, after it has solidified, forms the first heat sink portion 11.

FIG. 2 schematically shows a longitudinal section through an illumination device having a heat sink 1 according to various embodiments described above and depicted in FIG. 1. In FIG. 1 and FIG. 2, identical components are therefore provided with the same reference signs.

The illumination device 3 is formed as what is termed an LED retrofit and has two light-emitting diodes 4, which are arranged together with the electronic components 40 of a driver circuit for the light-emitting diodes 4 on a mounting circuit board 5, and a heat sink 1 and also four power supply lines 2 for supplying energy to the light-emitting diodes 4 and to the components 40 of the driver circuit. The mounting circuit board 5 is fastened on a surface on a first end side 101 of the heat sink 1. Four aluminum disks 121, 122, 123, 124 of circular disk shape are partially embedded, coaxially to the cylinder axis A-A and spaced apart from one another, in the plastic material of a cylindrical sub-portion 110 of a first heat sink portion 11 of the heat sink 1 which includes, e.g. consists of, thermally conductive plastic and the cylinder axis A-A of which corresponds to a longitudinal axis of the illumination device, such that said aluminum disks form cooling fins which protrude out of the lateral face of the cylindrical sub-portion 110 and extend around the lateral face. The four aluminum disks 121, 122, 123, 124 form a second, metallic heat sink portion 12 of the heat sink 1.

The first heat sink portion 11 including, e.g. consisting of, thermally conductive plastic is formed as a plastic injection-molded part and has a wedge-shaped sub-portion 111, which is formed as a base, e.g. as what is termed an S8 wedge base or base of IEC category W2.5×16. The first heat sink portion 11 includes, e.g. consists of, polyamides (PA) or polybutylene terephthalate (PBT) or of polyphenylene sulfide (PPS).

The four power supply wires 2 extend parallel to the cylinder axis A-A of the cylindrical sub-portion 110 of the first heat sink portion 11 of the heat sink 1 and are partially embedded in the plastic material of the first heat sink portion 11, such that only the ends 21, 22 of the power supply wires 2 protrude out of the first heat sink portion 11.

The first ends 21 of each of the power supply lines 2 are connected in an electrically conducting manner to an electrical contact or a conductor track on the mounting circuit board 5. The second ends 22 of the power supply lines 2 protrude out of the wedge-shaped sub-portion 111 of the first heat sink portion 11 and are each bent through an angle of 180° about the second end side 102 of the heat sink 1, such that two of the second ends 22 of the power supply lines 2 bear respectively against two mutually opposite outer sides of the wedge-shaped sub-portion 111.

The first end side 101 of the heat sink 1 and the mounting circuit board 5 with the light-emitting diodes 4 mounted thereon and the components 40 of the driver circuit are covered by a transparent, semi-spherical hood 6. The light-emitting diodes 4 emit red light during their operation. A first of the light-emitting diodes 4 serves for producing a taillight and both light-emitting diodes together serve for producing a brake light for a motor vehicle.

The embodiments are not limited to the embodiments explained in more detail above. By way of example, instead of a wedge-shaped sub-portion 111, the first heat sink portion 11 of the heat sink 1 can also have a differently shaped sub-portion, which instead of an S8 wedge base forms a bayonet-type base or a screw-type base and for this purpose is provided with a metallic base sleeve or electrical base contacts.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An illumination device, comprising:
   a heat sink, comprising:
      at least one heat sink portion comprising heat-conducting plastic;
      wherein in the plastic material of the heat-conducting plastic at least one metallic heat sink portion is at least partially embedded;
   at least one semiconductor light source; and
   a base, which is compatible with a standardized incandescent lamp base and is provided with power supply lines for supplying energy to the at least one semiconductor light source;
      wherein the at least one heat sink portion has a cylindrical sub-portion and a wedge-shaped sub-portion, and wherein the wedge-shaped sub-portion is formed as said base;

wherein said at least one metallic heat sink portion has a circular disk shape and is arranged coaxially with a cylinder axis of said cylindrical sub-portion, such that a circular outer edge of said at least one metallic heat sink portion of circular disk shape protrudes out of the plastic material of the heat-conducting plastic of the at least one heat sink portion and forms cooling fins which project from a lateral face of the cylindrical sub-portion;

wherein said at least one metallic heat sink of circular disk shape has apertures and said power supply lines are extending in parallel to the cylinder axis and are arranged in the apertures spaced apart from the at least one metallic heat sink of circular disk shape, such that a first end of each power supply line protrudes out of cylindrical sub-portion and a second end of each power supply line protrudes out of the wedge-shaped sub-portion.

2. The illumination device of claim 1, wherein the at least one heat sink portion consists of the heat-conducting plastic.

3. The illumination device of claim 1, wherein the at least one heat sink portion is in the form of a plastic injection-molded part.

4. The illumination device of claim 1, wherein the at least one heat sink portion has an electrically insulating form.

5. The illumination device of claim 1, wherein the at least one heat sink portion comprises at least one plastic selected from the group consisting of:
  polyamides;
  polybutylene terephthalate; and
  polyphenylene sulfide.

* * * * *